(12) United States Patent
Houston

(10) Patent No.: US 7,936,589 B2
(45) Date of Patent: May 3, 2011

(54) ADAPTIVE VOLTAGE CONTROL FOR SRAM

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 111 days.

(21) Appl. No.: 12/572,424

(22) Filed: Oct. 2, 2009

(65) Prior Publication Data

US 2010/0020591 A1    Jan. 28, 2010

Related U.S. Application Data

(62) Division of application No. 11/781,392, filed on Jul. 23, 2007, now Pat. No. 7,626,852.

(51) Int. Cl.
*G11C 11/00* (2006.01)
*G06F 7/20* (2006.01)
*G06F 9/455* (2006.01)
*G11C 29/00* (2006.01)

(52) U.S. Cl. ............ 365/154; 365/201; 703/13; 703/23; 714/721

(58) Field of Classification Search ............... 365/154, 365/155, 156; 703/13; 714/721
See application file for complete search history.

(56) References Cited

U.S. PATENT DOCUMENTS

| | | | |
|---|---|---|---|
| 5,159,571 A | | 10/1992 | Ito et al. |
| 5,532,969 A | * | 7/1996 | Houghton et al. ....... 365/185.16 |
| 6,208,565 B1 | * | 3/2001 | Riedlinger et al. ...... 365/189.12 |
| 6,380,779 B1 | | 4/2002 | Lachman et al. |
| 7,327,185 B2 | | 2/2008 | Mair et al. |
| 2002/0009012 A1 | | 1/2002 | Fujioka et al. |
| 2003/0160630 A1 | * | 8/2003 | Earle ................................ 326/17 |
| 2004/0095800 A1 | | 5/2004 | Lin et al. |
| 2005/0162122 A1 | | 7/2005 | Dunn et al. |
| 2006/0248416 A1 | | 11/2006 | Furukawa |
| 2006/0268647 A1 | * | 11/2006 | Yamaoka et al. ............. 365/226 |
| 2008/0082873 A1 | | 4/2008 | Russell et al. |
| 2008/0144421 A1 | | 6/2008 | Deng et al. |
| 2008/0148116 A1 | | 6/2008 | Deng et al. |
| 2008/0165694 A1 | | 7/2008 | Sauber |

* cited by examiner

*Primary Examiner* — Ly D Pham
(74) *Attorney, Agent, or Firm* — Rose Alyssa Keagy; Wade J. Brady, III; Frederick J. Telecky, Jr.

(57) ABSTRACT

The present invention pertains to semiconductor memory devices, and particularly to a system and method for adaptively setting the operating voltages for SRAM for both Vtrip and SNM to reduce power while maintaining functionality and performance, based on modeling and characterizing a test structure. One embodiment comprises an SRAM array, a test structure that characterizes one or more parameters that are predictive of the SRAM functionality and outputs data of the parameters, a test controller that reads the parameters and identifies an operating voltage that satisfies predetermined yield criteria, and a voltage controller to set an operating voltage for the SRAM array based on the identified operating voltage. One method sets an operating voltage for an SRAM by reading test structure data of the parameters, analyzing the data to identify an operating voltage that satisfies predetermined yield criteria, and setting the operating voltage for the SRAM based on the identified operating voltage.

16 Claims, 8 Drawing Sheets

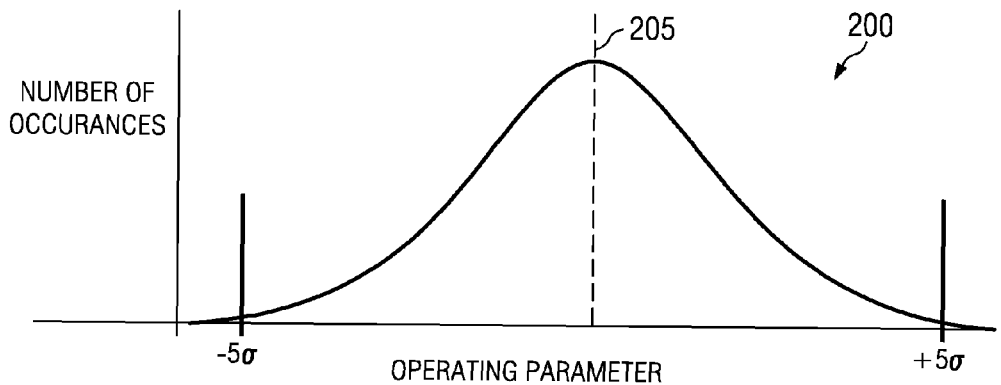
FIG. 2A
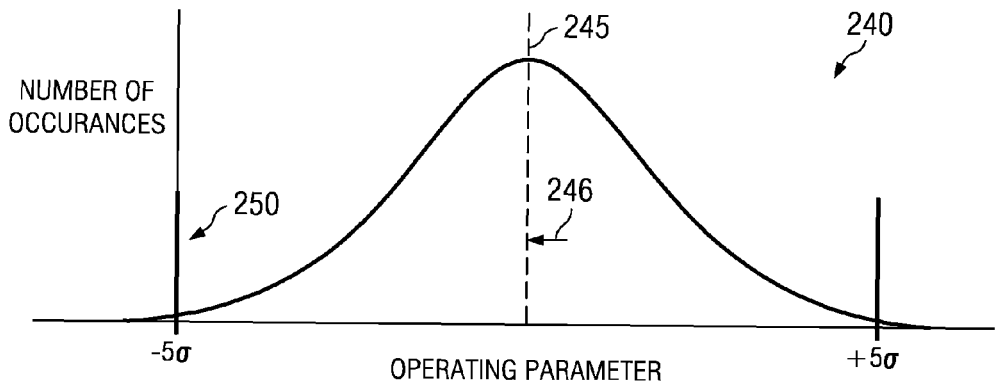
FIG. 2B
EXAMPLE OPERATING VOLTAGE SPECIFICATIONS OR SETTINGS (VS) AS A FUNCTION OF MEASURED TEST STRUCTURE CHARACTERISTICS (C)
FIG. 3A
|  | $C_{x1}$ | $C_{x2}$ | $C_{x3}$ | ∘ ∘ ∘ | $C_{xk}$ |
|---|---|---|---|---|---|
| $C_{y1}$ | $VS_{11}$ | $VS_{12}$ | $VS_{13}$ |  | $VS_{1k}$ |
| $C_{y2}$ | $VS_{21}$ | $VS_{22}$ | $VS_{23}$ |  | $VS_{2k}$ |
| $C_{y3}$ | $VS_{31}$ | $VS_{32}$ | $VS_{33}$ |  | $VS_{3k}$ |
| ∘∘∘ |  |  |  | ∘∘∘ |  |
| $C_{yj}$ | $VS_{j1}$ | $VS_{j2}$ | $VS_{j3}$ |  | $VS_{jk}$ |

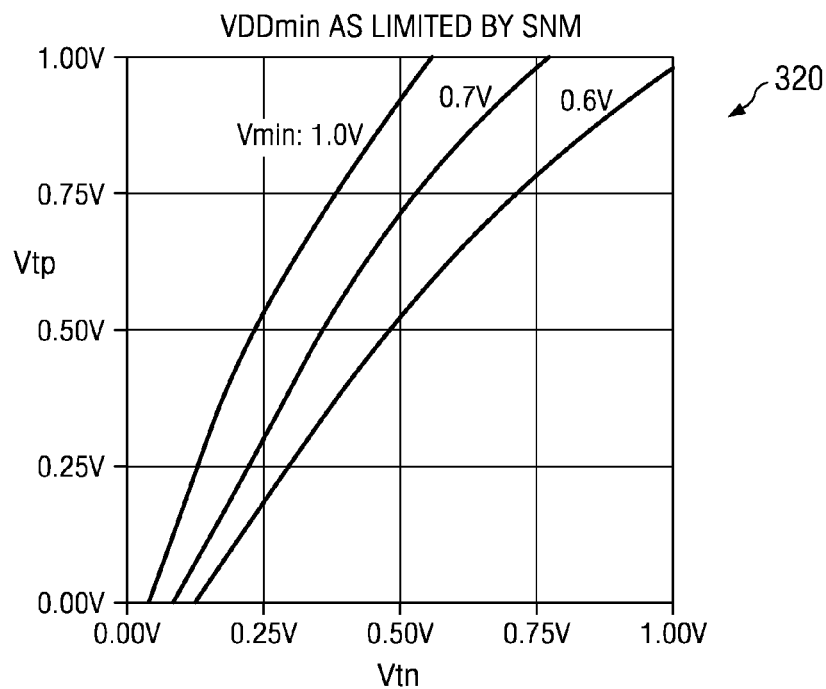
FIG. 3B
| | SET 1 | SET 2 |
|---|---|---|
| Vtn | 0.25V | 0.75V |
| Vtp | 0.50V | 0.75V |
| Vmin(SNM) | 1.00V | 0.60V |
| Vmin(Vtrip) | 0.50V | 0.70V |
| Vmin | 1.00V | 0.70V |
FIG. 3C
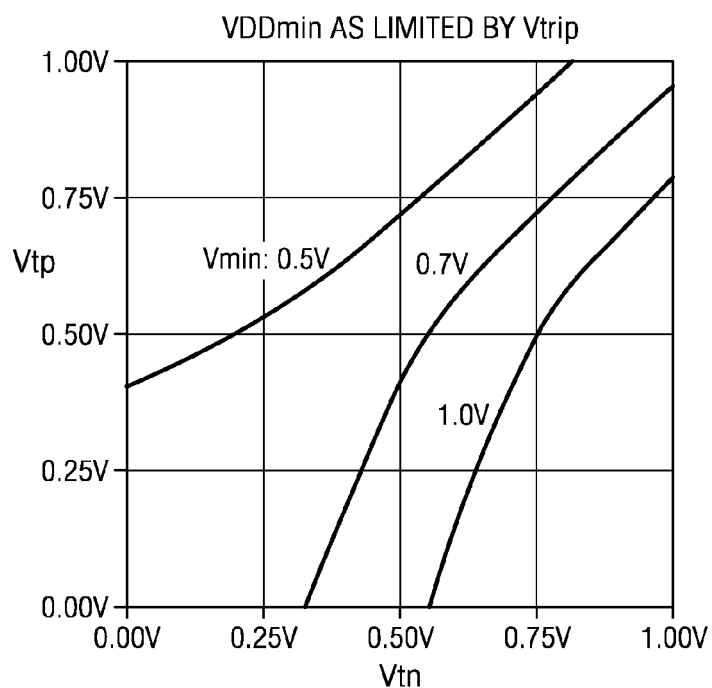
FIG. 3D

ADAPTIVE VOLTAGE CONTROL FOR SRAM

This is a division of application Ser. No. 11/781,392, filed Jul. 23, 2007, the entire disclosure of which is hereby incorporated by reference.

FIELD OF INVENTION

The present invention relates generally to integrated circuit design, and more particularly to a method and system for monitoring and adaptively setting the operating voltages for SRAM for both Vtrip and SNM, based on the modeling and characterization of a test structure to reduce power while maintaining functionality and performance.

BACKGROUND OF THE INVENTION

In integrated circuit (IC) manufacturing, a wafer or otherwise generally round substrate passes through a number of different fabrication stages to form one or more integrated circuits thereon. The wafer is generally formed out of a semiconductor material, such as silicon, and may pass through the different stages one or more times to form multiple layers upon the wafer. Throughout the process, the wafer and layers are treated in various manners to establish one or more semiconductor modules and elements upon the wafer. These modules can be considered the building blocks of the integrated circuits, and may also comprise other modules, sub-modules and/or elements, such as transistors, for example. A static random access memory (SRAM) cell is one type of semiconductor module, for example, that comprises a plurality of transistors as well as other types of integrated circuit elements. After the fabrication process is complete, one or more integrated circuits generally exist upon discrete sections of the wafer, known as die. The individual die can then be removed (e.g., cut) from the wafer and sold to consumers (e.g., as semiconductor "chips").

As noted, modules are made up of elements (e.g., transistors). It can be appreciated that variations within the fabrication process can affect element characteristics. Stated another way, variations of process conditions within the different fabrication stages can have an effect on the operating parameters and resulting performance of the elements and between elements. For example, varying (e.g., increasing) a process condition such as temperature, for example, at an annealing or heating stage of the fabrication process can, for example, facilitate a change in, among other things, a level of and/or rate of diffusion of a dopant substance in an element produced by the fabrication process (e.g., enhancing the level and/or rate of diffusion), whereby an operating parameter of the element, such as a switching speed of the element, for example, is resultantly altered (e.g., accelerated).

It can be appreciated that some variations within the fabrication process, or rather some variations of process conditions at the different stages of the fabrication process, can have a substantially uniform effect upon one or more elements fabricated thereby. For example, the operating parameter of threshold voltage (Vt) of a transistor type element is a function of multiple characteristics of the transistor, such as gate oxide thickness ($t_{ox}$) as well as level of channel doping, for example, where gate oxide thickness and channel doping are themselves a function of one or more process conditions at one or more fabrication stages.

Gate oxide thickness may, for example, be a function of a flow rate, temperature and/or viscosity, etc. of a substance applied to a wafer in establishing a layer of gate oxide material at a particular stage of the fabrication process, for example. A change in one or more of these process conditions will likely have the same effect on the thickness of the gate oxide layer across the entirety of the wafer or any resulting variations in the thickness of the gate oxide layer across the wafer will be gradual such that there will be substantially no resulting variation in thickness among elements that are in the same proximity. Accordingly, such variations in process conditions may be referred to as global variations since they have a substantially uniform effect upon the characteristic of gate oxide thickness ($t_{ox}$) and the operating parameter Vt across the wafer, or at least within a module. Similarly, uniform or gradual changes in characteristics, such as $t_{ox}$, for example, across a wafer can be referred to as global variations, and the effect of such global variations on similar elements within a module can be approximated to be the same. Also, element parameters, such as the aforementioned component of threshold voltage Vt, that vary as a result of other global variations can likewise be referred to as global variations.

As applied to an SRAM cell, for example, a global variation in the electrical characteristics of the elements will cause a variation in the operating parameters of the SRAM cell, such as static noise margin (SNM) and trip voltage (Vtrip). Exercising control over one or more process conditions to limit the global variation of the characteristics of the circuit elements (e.g., transistors) may in turn limit the range of operating parameters (e.g., SNM and/or Vtrip) of the SRAM cell incurred from the global variation of the circuit elements. If the global variation is essentially uniform across a die, then SRAM cells on a die will have the same operating parameters as influenced by the global characteristics of the elements.

To minimize power for a given required level of performance in an SRAM, one approach is to monitor the speed of example circuits, such as a ring oscillator, and lower the operating voltage if the frequency of the monitored circuit is above some predetermined frequency, or to raise the operating voltage if the frequency of the monitored circuit is below some predetermined frequency. This technique allows a lower voltage for "fast" silicon, saving power. That is, a chip with lower NMOS threshold voltage (Vtn) and/or a lower PMOS threshold voltage (Vtp) can run with a lower operating voltage.

However, SRAM functionality, such as static noise margin (SNM) and trip voltage (Vtrip), depends on the ratio of transistors as well as the magnitude of the Vt's. For example, the SNM of an SRAM cell depends on the ratio of the pass gate transistor to the driver transistor as well as the Vt of the driver transistor. The trip voltage Vtrip depends on the ratio of the pass gate to the load transistor as well as the threshold voltage Vt of the driver and the threshold voltage of the load transistor. Thus, because of Vtrip requirements, a chip having SRAM with a low Vtp and a nominal Vtn may not be able to run at as low an operating voltage as would be allowed for the logic portion of the chip, based on frequency requirements for the logic. Similarly, a minimum operating voltage Vmin for a chip with a low Vtn might be limited by the SNM requirements of the SRAM.

Another problem in determining an acceptable operating voltage for SRAM is that the minimum operating voltage will vary from cell to cell within an array due to random variation among the transistors. Such, variations that affect individual elements or cells differently can be referred to as local variations among the local parameters between elements or cells, for example. Thus, if measurements are made on a few transistors representing the transistors in a memory array, those transistors may not be typical of the array. Also, the transistors most likely will not represent the worst case cell among the many cells in an array, or a corresponding minimum operating voltage required for such cells.

In view of such global and local variations, a quantification of the performance, robustness or reliability of an SRAM device may be utilized which may be referred to as figure-of-merit (FOM) of an integrated circuit module, where the FOM of the module may be described in terms of a distribution of an operating parameter of the fabricated module, for example, such as noise margin (SNM) or trip voltage (Vtrip) for an SRAM cell.

It can thus be appreciated that element characteristics and resulting operating parameters of the elements are affected by both global and local variations where the elements are uniformly affected by the global variations but are affected on a more individual basis by the local variations. Because of these factors, setting a suitable operating voltage for SRAM is challenging in view of the numerous global and local variations which affect SRAM performance.

Thus, it would be desirable to be able to determine and set the operating voltages of an SRAM device for both Vtrip and SNM in a manner that reduces power while maintaining functionality and performance of the device.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to adaptively setting the operating voltages for SRAM for both Vtrip and SNM, based on the modeling and characterization of a test structure that evaluates or characterizes one or more parameters that are predictive of the SRAM functionality in order to reduce power while maintaining functionality and performance. The transistor characteristics on a chip can be characterized by a set of global parameters, about which individual transistors provide a variation of corresponding parameter values that can be modeled. The global parameters may vary from chip to chip, depending on lot, wafer, and position on a wafer. Given a select set of these global parameters, the present invention models the spread of SRAM cell characteristics caused by the chip variation.

According to one or more aspects of the present invention a system operative to adaptively set an operating voltage for SRAM for both Vtrip and SNM is disclosed. The system includes an SRAM memory array and a test structure that provides measurable characteristics of one or more parameters that are predictive of the functionality of the SRAM memory array and provides outputs data or results associated with the characteristics of the parameters. The system further includes a controller configured to set or generate an operating voltage for the SRAM memory array based on the characterization of the parameters and the predicted functionality of the SRAM.

In accordance with one or more other aspects of the present invention, a method for setting operating voltages for an SRAM memory device is disclosed. The method includes reading test structure data of the parameters of an SRAM array, and analyzing the test structure data to identify an operating voltage that satisfies predetermined yield criteria.

The method thus further includes setting or generating the operating voltage for the SRAM array based on the identified operating voltage.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings

BRIEF DESCRIPTION OF THE DRAWINGS

FIGS. 2A and 2B are exemplary histograms of a distribution of output data or parameter values of a selected SRAM operating parameter of an SRAM array about a global value for a given instance of global element parameter values.

FIG. 3A is a table of exemplary operating voltage specifications or settings as a function of measured test structure characteristics of FIG. 1.

FIGS. 3B-3D are graphs and a table of the relation between exemplary global parameters and a minimum acceptable drain voltage VDDmin.

DETAILED DESCRIPTION OF THE INVENTION

Figure 1A:
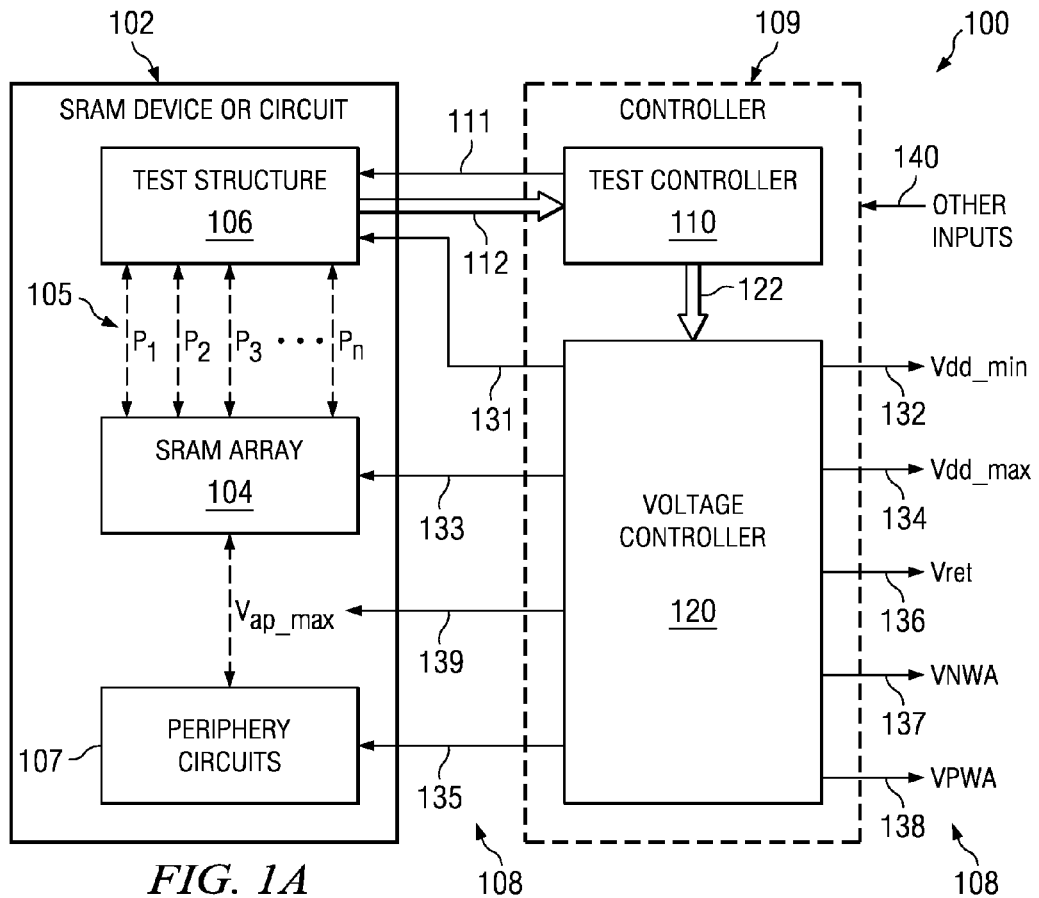
FIGS. 1A and 1B are functional block diagrams of a system configured to adaptively set an operating voltage of an SRAM memory device in accordance with one or more aspects of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, that one or more aspects of the present invention may be practiced with a lesser degree of these specific details. In other instances, well-known structures and devices are shown in block diagram form in order to facilitate describing one or more aspects of the present invention.

An adaptive voltage control (AVC) system is implemented to set the operating voltages of an SRAM memory device utilizing a structure or test structure that evaluates or characterizes one or more global parameters that are related to the SRAM functionality as determined through statistical analysis among other things.

Setting Voltage Bounds for SRAM Functionality:

Adaptive voltage control (AVC) can be used to adjust the voltage to meet speed requirements with minimum power for the current conditions. For example, lower the voltage with fast silicon or slow clock; raise the voltage for slow silicon or fast clock. For many logic circuits, the speed and power, but not functionality, are affected by the voltage setting. For SRAM, the functionality is sensitive to the supplied voltages. Generally, the static noise margin (SNM) may be degraded at either high or low voltage while the trip voltage (Vtrip) is degraded by low voltage. Thus for a circuit including an SRAM, it may be important to have bounds (e.g., upper and/or lower limits) for the range of voltage that may be set by the AVC to maintain SRAM functionality. The voltage selected by the AVC can be optimized to the power/speed of the overall circuit so long as the voltage selected is within the bounds for SRAM functionality. The bounds for SRAM functionality will depend on the circuit element properties (parameter characteristics) which in turn are dependent on process and operation history and operating conditions such as temperature. A goal of this invention is to adaptively set the bounds of these voltages to maintain SRAM functionality. Optionally, the voltage may be set at a bound for SRAM functionality, or may be set within the bounds to optimize the logic performance.

Applying Different Voltages to the Periphery and Array:

For an SRAM, there are several voltages that are critical to functionality. These include the voltage across the memory or storage element (VDDAR and VSSAR), the word line voltage (VWL), the bit line precharge voltage for the READ cycle (VBLPC), and the voltage to which the BL is driven during a WRITE cycle (VDDWRITE). These voltages may be set to different values. When these voltages are set to different values, the relation among the values as well as the individual values can be important for the SRAM functionality. For example, when VDDAR, VWL and VDDWRITE are all equal, a lower voltage may degrade Vtrip, however, if set separately, a lower VDDAR for a given VWL may improve Vtrip. Similarly, lowering VBLPC relative to VDDAR and VWL within a bound will generally improve SNM, but will generally degrade SNM if lowered beyond the bound which depends in part on the Vtn of the pass gate. Raising VWL relative to VDDAR typically improves Vtrip and degrades SNM. Thus when the transistor global parameters favor SNM relative to Vtrip, a raised VWL will improve the robustness of the SRAM functionality, and vice-versa.

For some embodiments that include SRAM and logic, some of the SRAM periphery voltages (e.g., VBLPC) may be tied to the voltage supplied to the logic, while the array voltage VDDAR may be independent. The AVC must then take VDDAR into account when setting the bound of the logic voltage. For example, a lower VDDAR may allow a lower logic voltage and a higher VDDAR may allow a higher logic voltage. For example, the logic voltage may be limited to a range from VDDAR−0.5V to VDDAR+0.05V, where these exact values depend in part on the transistor global parameters. Thus, the AVC system may be used to control separate values for the array voltage (e.g., VDDAR and VSSAR) and at least one of the periphery voltages (e.g., VBLPC, VWL), where the periphery voltage may be tied to the logic voltage.

The test structure of the AVC system is configured and utilized to measure one or more test parameters (e.g., delay of a delay chain, frequency of a ring oscillator, or transition voltage of an inverter) that are related to operating parameters of an SRAM memory array (e.g., SNM, Vtrip, or Iread). Optionally, transistors in the test structure are replicas of transistors in the SRAM array. Any given instance of a test structure will produce a value of a test parameter that is somewhere in the distribution of possible values for that parameter, where the value produced reflects the current condition of the instance as may be affected by conditions in manufacture, current operating conditions, and prior history of operation.

A test controller of the system is configured to then read the output data of the one or more parameters evaluated or characterized in the test structure and to identify an operating voltage that satisfies predetermined yield criteria or a predetermined performance response of the SRAM where the relation among the test parameter(s), the operating voltage(s), and the SRAM performance has been determined by previous analysis, for example by modeling and statistical analysis. The system further comprises a voltage controller configured to set or generate the operating voltage for the SRAM memory array based at least in part on the output of the test controller. For example, the voltage controller may generate a voltage at the minimum bound prescribed by the test controller so as to minimize power, or may generate a voltage at the maximum bound prescribed by the test controller so as to maximize performance. The voltages thus controlled may include the array source voltage VSSA, the array supply voltage VDDA, the array n-well voltage VNWA, the array p-well voltage VPWA, the array BL precharge voltage VBL, and the array WL voltage VWL.

In the present invention, the output data of the test structure(s) and the operating parameters of the SRAM are modeled and analyzed to identify the relation of the test structure data and the functionality of the SRAM as a function of voltage(s). Typically, the test structures are designed such that the impact of local variation on test structure data is minimized so that the test structure data will be representative of global parameters. This minimization of the impact of local variation can be done, for example, by using wide transistors and/or connecting several devices in parallel or in series. The operating parameters of the SRAM can be simulated as impacted by local variation as a function of global parameters and as a function of voltage(s). Then, given an acceptable range of SRAM operating parameters as impacted by local variation, an acceptable range of voltage(s) can be correlated with the values of data from the test structure(s).

For example, the distribution of an SRAM operating parameter (e.g., SNM or Vtrip) can be simulated at various voltage, temperature, and global parameter values, where the distribution is a result of local variation of the SRAM element parameters. A range of voltages as a function of global parameters that give adequate margin for the SRAM operation can be determined from this set of simulations. For example, it may be found that an acceptable distribution of both SNM and Vtrip is obtained with VDD from 0.9V to 1.1V when the global parameters correspond to a strong NMOS and a weak PMOS, while the acceptable voltage range for VDD is 1.08V to 1.26V when the global parameters correspond to a weak NMOS and a strong PMOS. Further simulations can be used to correlate measurable characteristics of test structures to global parameters and thus allow a correlation of the SRAM voltage ranges for acceptable distribution of SRAM operation parameters to the measurable characteristics of the test structures. For example, a PMOS dominated delay chain slower than 10 ns along with an NMOS dominated delay chain faster than 10 ns may correlate with an acceptable SRAM VDD range of 0.9V to 1.1V while a PMOS dominated delay chain faster than 10 ns along with an NMOS dominated delay chain slower than 10 ns may correlate with an acceptable SRAM VDD range of 1.08V to 1.26V.

In addition, numerous operating parameters may be statistically analyzed and modeled to identify a selected set of operating parameters or key global parameters which best characterize the SRAM memory cells and which best correlate to the simulations.

It will be appreciated that the test structure output data analyzed by the test controller comprises both global and local variations associated with the operating parameters, and such variations will occur with some probability distribution. For example, Vt variation from random doping fluctuation or RDF is generally Gaussian. However, while the global variation can usually be monitored and limited by process control to some bound (e.g., to +/−3 sigma), local variations (e.g., from RDF) generally can not be so limited, and thus the expected distribution of the local variation and the impact on operating parameters must be taken into account in the design in accordance with yield requirements. The probability of the operating parameters being within specification may depend on the distribution of local variation, the values of the global parameters, and the supplied voltages. For an SRAM module, for example, if the failure point of a cell at a given combination of global parameters and voltage settings is at one out of 3 million occurrences of a local variation, then it can be expected that approximately one out of 3 million elements (e.g., memory cells) within the module will fail at that combination of global parameters and voltage settings due to that local variation.

The sensitivity to local variation in some modules such as inverter chains is reduced by the averaging effect of elements in series. The more stages there are in an inverter chain, the less the sensitivity to the local variation of each stage. Also, sensitivity of a module to local variation can be reduced by using elements that have less local variation, such as wide transistors compared to narrow transistors, or by having multiple elements in parallel. However, other modules, such as SRAM cells may be sensitive to the variations of single elements because of the lack of averaging among elements and the need to use elements with relatively large variation, for example, narrow transistors. The test structure of the present invention is generally chosen to be relatively insensitive to local variation, for example, by averaging effects or use of elements with relatively small local variation.

The structure or test structure of the present invention is designed to characterize or simulate the key global parameters which provide the output data or parameter values associated with the operating parameters. For accuracy, for example, the test structure measurements of the parameter values could be made on relatively large transistors to minimize the random variation of the measured transistor, or a number of smaller transistors in parallel, where the smaller transistors more accurately represent the SRAM cell transistors. The measurements could be the frequency of ring oscillators or the delay of delay chains, where the number of transistors in the ring or chain can be designed to be dependent primarily on NMOS or on PMOS strength. For example, for an inverter chain with high capacitance on every other node starting with the output node of the first inverter, the delay for an input high-to-low transition will depend primarily on the PMOS strength while the delay for an input low-to-high transition will depend primarily on NMOS strength.

Similarly, a chain of NANDs can be designed to be primarily sensitive to NMOS strength and a chain of NORs primarily sensitive to PMOS strength. The transistors in the chains can be made to replicate the SRAM cell transistors, with separate measurements to characterize the driver, pass gate, and load transistors of the SRAM cell. One measurement could be made for characterization of both the pass-gate and driver assuming the characteristics of both correlate. Alternatively, the ratio of SRAM transistor strengths can be measured more directly by measuring the output voltage of an inverter where the output is tied to the input and the inverter is formed with transistors similar to the transistors in the SRAM cell, including minimizing the effect of the pass gate for conditions where the pass gate is turned on.

Multiple such structures can be connected in parallel to reduce the effect of random variation. Another measurement would be to sweep the input to such inverters and measure the voltage at which the output transitions (between data states). The SNM and Vtrip of SRAM cells can also be measured. The read current Iread can also be characterized.

Given the measurements, and in accordance with an aspect of the present invention, a correlation is made to the functionality of the SRAM cell as a function of the operating voltage to determine the allowable Vmin. Preferably, the measurement will be made on a structure that has reduced sensitivity to random variation such that the measurement represents a mean value for the array for which the voltage is being controlled. Simulations that encompass random radiation can then be used to predict the minimum acceptable voltage for the given mean parameter values. Tables can be established from simulations to correlate the measured characteristics to the minimum acceptable voltage allowing for variation of the cells in an array. For real time control (adaptive control), the correlation table would not have to allow for variation of temperature as such environmental effects are inherent in the characteristics of the test structure. If the measurements directly relate to the SRAM cell functionality, the structure can be skewed toward failure by an amount based on simulation of the needed margin from mean to worst case in light of random variation.

Such SRAM test structure simulation, characterization, and data analysis could, for example, be used to predict the global operating parameter values and operating voltages required to achieve an acceptable SRAM module/device yield or an acceptable performance level or criteria.

In one embodiment, a test structure (e.g., using NOR and NAND oscillators) and an SRAM operating parameter such as Vtrip and SNM may be correlated to determine a limitation on lowering a supply voltage (e.g., VDDA). For example, the supply voltage $SRV_{DD}$ of the test structure is determined by simulation as a function of a plurality of random process vectors (e.g., manufacturing variables), for example, by monitoring the frequency of oscillation of the NOR and NAND oscillators within the test structure. SNM and Vtrip may then be determined that results from the determined $SRV_{DD}$ values at each of the plurality of random process vectors from the simulations. These SNM and Vtrip values may then be plotted in relation to a frequency ratio of the NOR oscillator to the NAND oscillator, defined as a value β. From the plot, a threshold of the β at which Vtrip failures are observed may then be identified, for example, at a threshold value of β<about 0.69 there may be no predicted failures. Finally, the supply voltage $SRV_{DD}$ is increased for chips or SRAM devices corresponding to a value of β that exceeds the identified threshold value of β.

These and other considerations which apply to the present invention will become more apparent in association with the discussions of the illustrated figures, infra.

In integrated circuit (IC) manufacturing, a wafer is passed through a number of different fabrication stages in forming one or more integrated circuits on the wafer. Throughout the fabrication process the wafer and layers formed thereon are treated in various manners to establish one or more semiconductor modules upon the wafer. These modules can be considered the building blocks of the integrated circuits, and may also comprise other modules, sub-modules and/or elements, such as transistors, for example. A static random access memory (SRAM) cell is one type of semiconductor module, having a plurality of transistor type elements, for example. After the fabrication process is complete, one or more integrated circuits generally exist upon discrete sections of the wafer, known as die. The individual die can then be removed (e.g., cut) from the wafer and sold to consumers (e.g., as semiconductor or processing "chips").

Turning to FIG. 1A, an adaptive voltage control (AVC) system 100 is illustrated that is configured to adaptively set one or more operating voltages of a static random access memory (SRAM) device or circuit 102, for example, in accordance with one or more aspects of the present invention. The AVC system 100 is depicted schematically in functional block diagram form and includes an SRAM memory array 104 comprising one or more memory cells (not shown) configured to store one or more data states.

The AVC system 100 also includes a structure (e.g., test structure(s)) 106 configured to characterize one or more test parameters (e.g., delay of a delay chain, frequency of a ring oscillator, or transition voltage of an inverter) associated with one or more global parameters 105 (e.g., P1, P2, P3 . . . Pn, SNM, Vtrip, or Iread) that are predictive of the functionality or performance of the SRAM memory array 104. A distribution of output data or parameter values 112 associated with global parameters 105 of the SRAM memory array 104 is made available by the test structure 106, for example. In other words, the structure 106 is configured to characterize one or more global parameters (e.g. threshold voltages, drive currents, ratios of threshold voltages, or ratios of drive currents) 105 that may be correlated with one or more operating parameters of the SRAM memory cell or memory array 104.

A controller 109 comprising a test controller portion 110 and a voltage controller portion 120 of the controller 109 of the system 100, is configured to exercise the test structure 106 and, based on the output data 112 of the test structure 106 that are predictive of the functionality of the SRAM, identifies one or more settings for test structure operating voltages or operating voltage settings 122 for the SRAM device 102 which comprises the SRAM array 104, periphery circuits 107, and the test structure 106 that satisfies one or more predetermined yield criteria, one or more predetermined performance criteria or a predetermined performance response of the SRAM 102. The operating voltage settings 122 may include, for example, a minimum drain voltage Vdd_min 132, a maximum drain voltage Vdd_max 134, a retention voltage Vret 136, an n-well voltage VNWA 137, a p-well voltage VPWA 138, an array voltage, a bit line precharge voltage, a write driver voltage, a word line voltage, a difference between the array voltage and the bit line precharge voltage, and a difference between the array voltage and the word line driver voltage, and a maximum allowable voltage difference between an array voltage and a periphery voltage Vap_max 139, as a result of characterizing and analyzing the output data 112.

The identification of the test structure and settings for SRAM operating voltage(s) 122 may be performed, for example, with the test controller portion 110 by evaluating the output data 112 and use of a look-up table based on modeling and statistical analysis, for example. The voltage controller portion 120 of the controller 109 is configured to set or generate one or more operating voltages 108 for the SRAM memory array 104 and the periphery circuits 107 based at least in part on the identified settings for operating voltage(s) 122.

For example, the voltage controller 120 may be further configured to provide output voltages 108 such as test structure voltages 131, SRAM array voltages 133 and periphery circuit voltages 135. In other words, the output 112 of the test structure 106 is input to the controller 109 which is configured to set the voltage of the SRAM array 104, for example, at least in part in response to the output 112 of the test structure 106. The voltages set by the controller 109 in response to the output 112 of the test structure 106 are designed to have the operation of the SRAM array 104 supplied by the voltage controller 120 meet specifications.

Other inputs 140 may also be provided to the test controller 140 or voltage controller 120 of controller 109. For example, these may include system inputs such as the chip supply voltage(s); the operating conditions, such as a high performance mode, slow mode, or standby; and the system clock. Other inputs can be provided to other inputs 140 from ROM or a fuse bank that give information to be used in choosing voltage settings 122. For example, different applications of the same chip may have different preferences for voltage settings. Also, characterization done at test, for example, measurement of Vtn and Vtp, may be a basis for choosing different voltage settings.

For a given instance of AVC system 100, the output data 112 from the test structure 106 is one set of values from a distribution of possible parameter values. The particular values are determined at least in part by the global parameters of the test structure 106 which in turn may be determined in part by the process and operating history and the current conditions of this instance (e.g. temperature and voltages). The global parameters of the test structure 106 may be correlated with the global parameters 105 of the SRAM array 104 of this instance. Thus the values of the output data 112 from the test structure 106 can be used to set the voltage settings 122 for the SRAM 104 for the given instance to meet specification in so far as the global parameters 105 of the SRAM can be correlated with the voltage requirements for the SRAM to meet specifications.

It is to be appreciated that the term "SRAM array" can refer to a single cell, a sector, multiple sectors, an array, or any other group of memory cells of an SRAM memory array. "Voltage controller" may likewise refer to a controller comprising hardware, software, or a combination of hardware and software configured to set or generate one or more voltages of an SRAM memory array. It is also to be appreciated that the AVC system may comprise an integrated circuit (IC), a semiconductor device, a semiconductor chip, or a package, for example. It is further appreciated that one or more of the AVC system components may reside separately from the remaining portion of the AVC system on the IC, semiconductor device, chip or package, for example.

It will also be appreciated that the term test structure may comprise one of an inverter chain, a chain of SRAM cells arranged as inverters, a chain of series-parallel combinations of SRAM cells, a ring oscillator, a delay chain, a chain of NAND or NOR gates, a chain of devices that replicate cell transistors of the SRAM memory array, and another module which characterizes the one or more global parameters that are related to the functionality of an SRAM memory array, for example. In addition it will also be appreciated that one or more predetermined performance criteria may be chosen for the functionality of these structures, comprising one or more of a functionality of the test structure, a functionality of a portion of the test structure, a switching speed, a frequency, a transition response time, a delay time, retention of a data state, retention of a data state after a predetermined time period, access time (Iread) and ability to be written (Vtrip), and stability. In addition, the voltage required for adequate operation of an SRAM may also be defined as a voltage required for the SRAM to meet the predetermined performance criteria.

It may also be appreciated the term "test controller" can refer to a computer-related entity (e.g., hardware, a combination of hardware and software, software, software in execution, a process running on a processor, a processor, an object, an executable, a thread of execution, a program, a computer, an application running on a server, a server). The test controller may comprise an integrated circuit on chip with the test structure(s). Data may likewise refer to information that is in a useable format and/or that can be manipulated in a desired manner (e.g., by a computer).

Figure 1B:
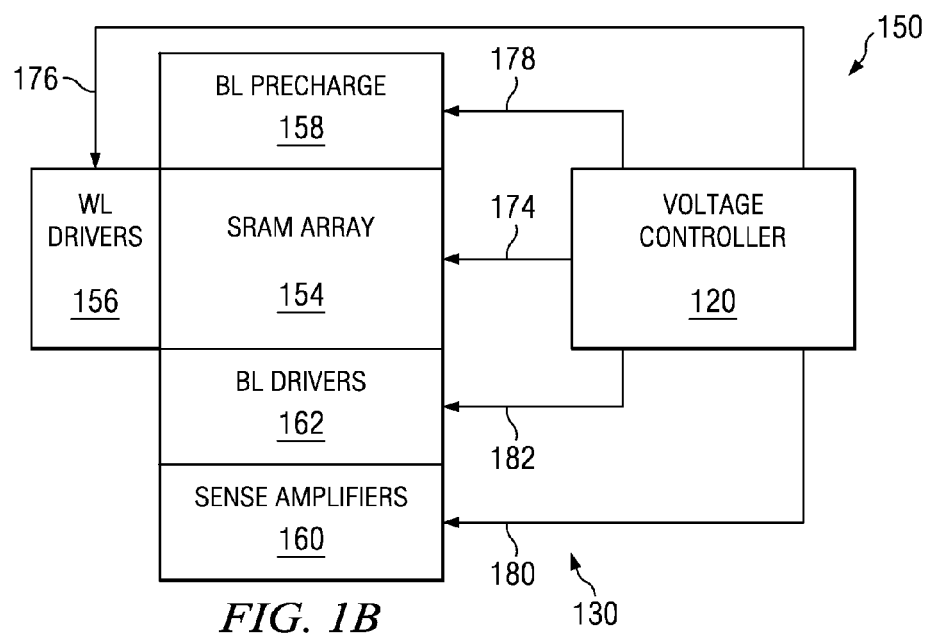

FIG. 1B shows additional detail for a portion of the AVC system 100 of FIG. 1A. In FIG. 1B we show the voltage controller 120, the SRAM memory cell array 154, and the word line drivers 156, the bit line precharge circuits 158, the sense amplifiers 160, and the bit line drivers 162 associated with the cell array 154. The voltage controller 120 supplies voltages 174 to the cell array 154, voltages 176 to the WL drivers 156, voltages 178 to BL precharge circuits 158, voltages 180 to sense amplifiers 160, and voltages 182 to bit line drivers 162. Each of the voltages 174, 176, 178, 180, and 182 may include one or more supply voltages (e.g., VDDA, VWL, VBL, VSA, one or more sinking voltages (e.g., VSSA, VSSWL, VSSBL, VSSSA), and one or more well or substrate voltages (e.g. VnwellA). The specification of voltages from the test controller 110 of FIG. 1A may specify each of the voltages 174, 176, 178, 180, and 182 individually or in relation to one another. For example, VWL may be specified to be offset from VDDA by some amount, or VBL may be specified to be within some range of VDDA.

FIGS. 2A and 2B illustrate exemplary histograms of a distribution of values of a selected SRAM operating parameter of an SRAM array (e.g., SNM or Vtrip) about a global value for a given instance of global element parameter values (e.g., 205 of FIG. 1) and other conditions including voltage settings including VDD. The spread of the distribution of the values of the operating parameter of an SRAM array is caused by local variation. The distribution can be projected by simulations or by measurements as is known in the art.

If, for example, an acceptable yield is expected for a distribution of the operating parameter for which the 5 sigma point is greater than or equal to zero, then FIG. 2A illustrates an acceptable distribution 200 of the selected operating parameter values for the given global parameters 205 with VDD=VDD1 since in the present example of FIG. 2A, all the values between the +/−5 sigma bounds are greater than zero.

With the same criterion for acceptability, FIG. 2B, for example, illustrates another acceptable distribution 240 of the selected operating parameter of the SRAM array where VDD has been changed from VDD1 (e.g., 205 of FIG. 2A) to VDD2 (e.g., 245 of FIG. 2B) and the distribution of the selected SRAM operating parameter has shifted 246 in response to the change in VDD such that the value of the selected operating parameter of the SRAM array at the 5 sigma point is equal to zero 250. If, for example, VDD2 is less than VDD1 and further lowering of VDD to below VDD2 would cause a further shift of the distribution such that the value of the selected operating parameter of the SRAM array at the 5 sigma point would be less than zero, then VDD2 would be specified as the minimum voltage for VDD at the given instance of global element parameter values and other conditions. Similarly, if in this example, VDD2 is greater than VDD1 and a further increase of VDD above VDD2 would cause a further shift of the distribution such that the value of the selected operating parameter of the SRAM array at the 5 sigma point would be less than zero, then VDD2 would be specified as the maximum voltage for VDD at the given instance of global element parameter values and other conditions.

It is to be appreciated that the distribution of a selected operating parameter of an SRAM array is a function of the various global element parameters, and thus, in the preceding example, there may be a different value for minimum VDD for a different instance of element global parameters and other conditions where the difference in other conditions may comprise a difference in other voltage settings such as VWL 176 and VBL 182. Also, it is to be understood that the criterion for acceptability of the distribution of an operating parameter of the SRAM may be other than that the value of the operating parameter be greater than zero at the 5 sigma point (FOM or the margin for operation for local variation $\geqq 5$ sigma). The criterion may be that the value of the operating parameter is greater or less than a specified value (that may be other than zero) at a specified point in the distribution (that may be other than the 5 sigma point).

FIG. 3A illustrates a table 300 of exemplary operating voltage specifications or settings (122 of FIG. 1) as a function of measured test structure characteristics (112 of FIG. 1) that satisfy some predetermined yield or performance criterion, for example. Table 300 is illustrated as two dimensional. It is to be understood that such a table may be one dimensional (The voltage specification being dependent on a single characteristic) or multi-dimensional (the voltage specification being dependent on multiple characteristics). As an example, the Cxk may be characteristics relating to the PMOS transistor (e.g., Vtp, the delay of a PMOS dominated delay chain, or the frequency of a PMOS dominated ring oscillator) and the Cyj may be characteristics relating to the NMOS transistor (e.g., Vtn, the delay of an NMOS dominated delay chain, or the frequency of an NOMS dominated ring oscillator). Alternatively, the C may be characteristics of test structures that involve both NMOS and PMOS transistors or structures. The C may be voltages. The voltage specifications VSij may be minimum voltages, maximum voltages, specific voltages, or relations among voltages such as ratios or differences, for example. The voltage specifications may, for example, be related to a single operating parameter of the SRAM array such as the maximum VDDAR for acceptable SNM, or may be related to multiple SRAM array parameters such as the minimum VDDAR for both acceptable SNM and acceptable Vtrip.

Accordingly, regardless of the analysis mechanism used by the test controller 110, for example, the various characterization parameters are characterized and modeled, and the data is analyzed to identify the voltage specification or setting for the predetermined minimum acceptable performance criteria for the SRAM.

FIGS. 3B-3D illustrate the relation between exemplary voltage specification Vmin as a function of global parameters Vtn and Vtp for the SRAM operating parameters SNM and Vtrip.

The curves 320 of FIG. 3B, for example, illustrate Vmin as a function of Vtp and Vtn where adequate SNM for acceptable yield is the criterion for setting Vmin. Similarly, the curves 370 of FIG. 3D illustrate Vmin as a function of Vtn and Vtp where adequate Vtrip for acceptable yield is the criterion for setting Vmin. FIG. 3C illustrates two example sets of Vtn and Vtp and the associated Vmins both with SNM and with Vtrip as the criterion. In set 1, Vmin with SNM as the criterion is higher than Vmin with Vtrip as the criterion. Thus, for set 1, Vmin with SNM as the criterion is the limiting Vmin with both SNM and Vtrip as criteria. This is entered as Vmin for the set. Similarly in set 2, Vmin with Vtrip as the criterion is higher than Vmin with SNM as the criterion. Thus, for set 2, Vmin with Vtrip as the criterion is the limiting Vmin with both SNM and Vtrip as criteria.

Figure 4A:
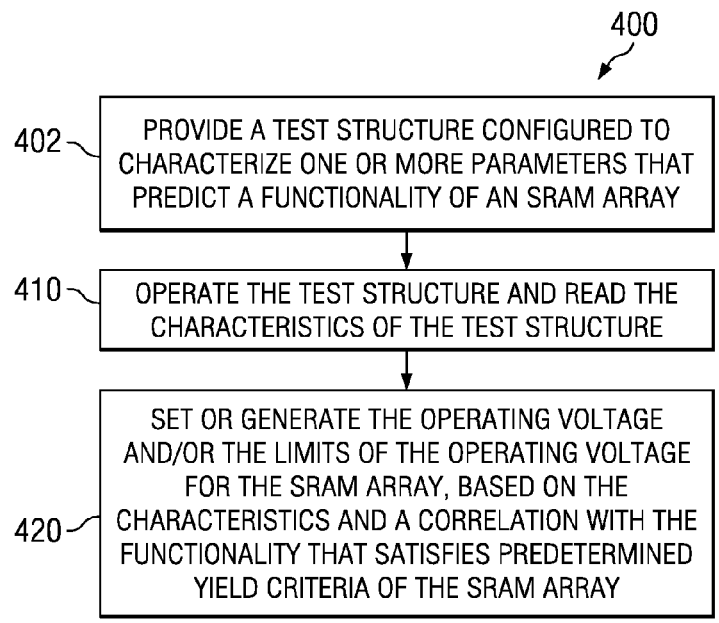
FIGS. 4A-4C are flow diagrams illustrating an exemplary methodology operative to set an operating voltage for an SRAM memory device based on test structure data that models an SRAM array in accordance with one or more aspects of the present invention.
Figure 4B:
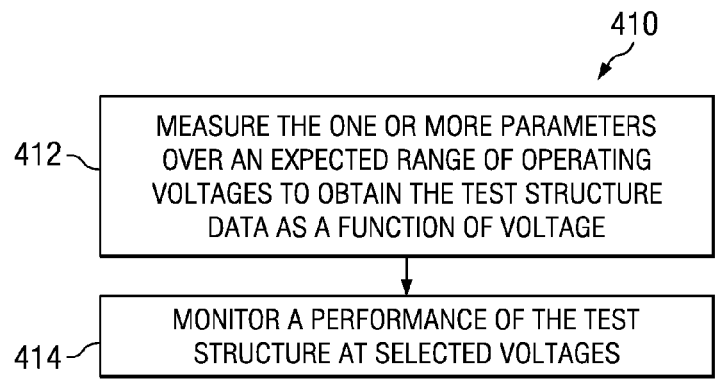
Figure 4C:
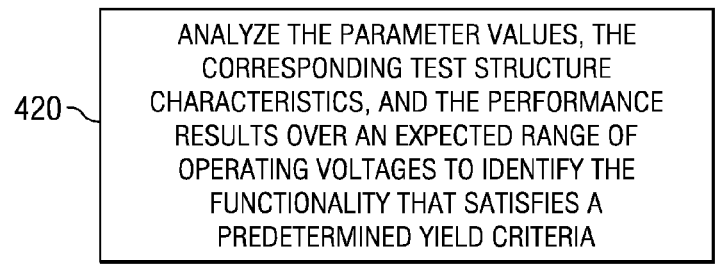

FIGS. 4A-4C illustrate an exemplary methodology 400 that facilitates adaptively setting or generating an operating voltage for an SRAM memory device based on test structure data that models an SRAM array in accordance with one or more aspects of the present invention, such as may be used in the adaptive voltage control (AVC) system 100 of FIG. 1.

It will be appreciated that although the methodology 400 is illustrated and described hereinafter as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

With reference to FIG. 4A, the method 400 begins at 402 where a test structure (e.g., 106 of FIG. 1) is provided being configured to characterize one or more parameters that predict a functionality of an SRAM array. After the test structure (e.g., 106 of FIG. 1) is provided, the method advances to 410 where the test structure 106 is operated, and data (e.g., 112 of FIG. 1) characteristic of the one or more global parameters (e.g., 105 of FIG. 1) that are predictive of the functionality of the SRAM array (e.g., 104 of FIG. 1) is read (e.g., by test controller 110 of FIG. 1) from the test structure. Thereafter, at 420 the operating voltage (e.g., 108 of FIG. 1) and/or the limits (bounds) of the operating voltage (e.g., SRAM operating voltage 133, periphery circuit operating voltage 135, and test structure operating voltage 131 of FIG. 1) is set and/or generated, based on the test structure characteristics and a correlation thereto that satisfies predetermined yield (or performance) criteria (e.g., with Vdd≧1.2 volts, the margin for operation for local variation is ≧5 sigma). The specified margin for operation that satisfies a predetermined yield (or performance) criterion may be set relative to a margin tested at screening. If the margin for operation provided by the specified operating voltage is greater than the margin at screen, there should be no failures in operation.

Alternately, with reference to FIG. 4B, the data reading step 410 of the method 400, may comprise measuring the one or more parameters at 412 over an expected range of operating voltages to obtain the test structure data (e.g., 112 of FIG. 1, Vdd1 local variation distribution 200 of FIG. 2A or 240 of FIG. 2B) as a function of voltage and thereafter monitoring at 414 a performance of the test structure (e.g., 106 of FIG. 1) at selected voltages (Vdd1 205 of FIG. 2A, Vdd2 245 of FIG. 2A).

Further, with reference to FIG. 4C, the correlation and characterization of step 420 comprises analyzing the one or more parameter values (e.g., 105 of FIG. 1,), the corresponding test structure characteristics (e.g., 112 of FIG. 1, and data 200 of FIG. 2A), and the performance results over an expected range of operating voltages (e.g., 112 of FIG. 1, and data 200 of FIG. 2A) to identify the functionality that satisfies a predetermined yield criteria (e.g., margin ≧5 sigma as in FIG. 2).

Figure 5:
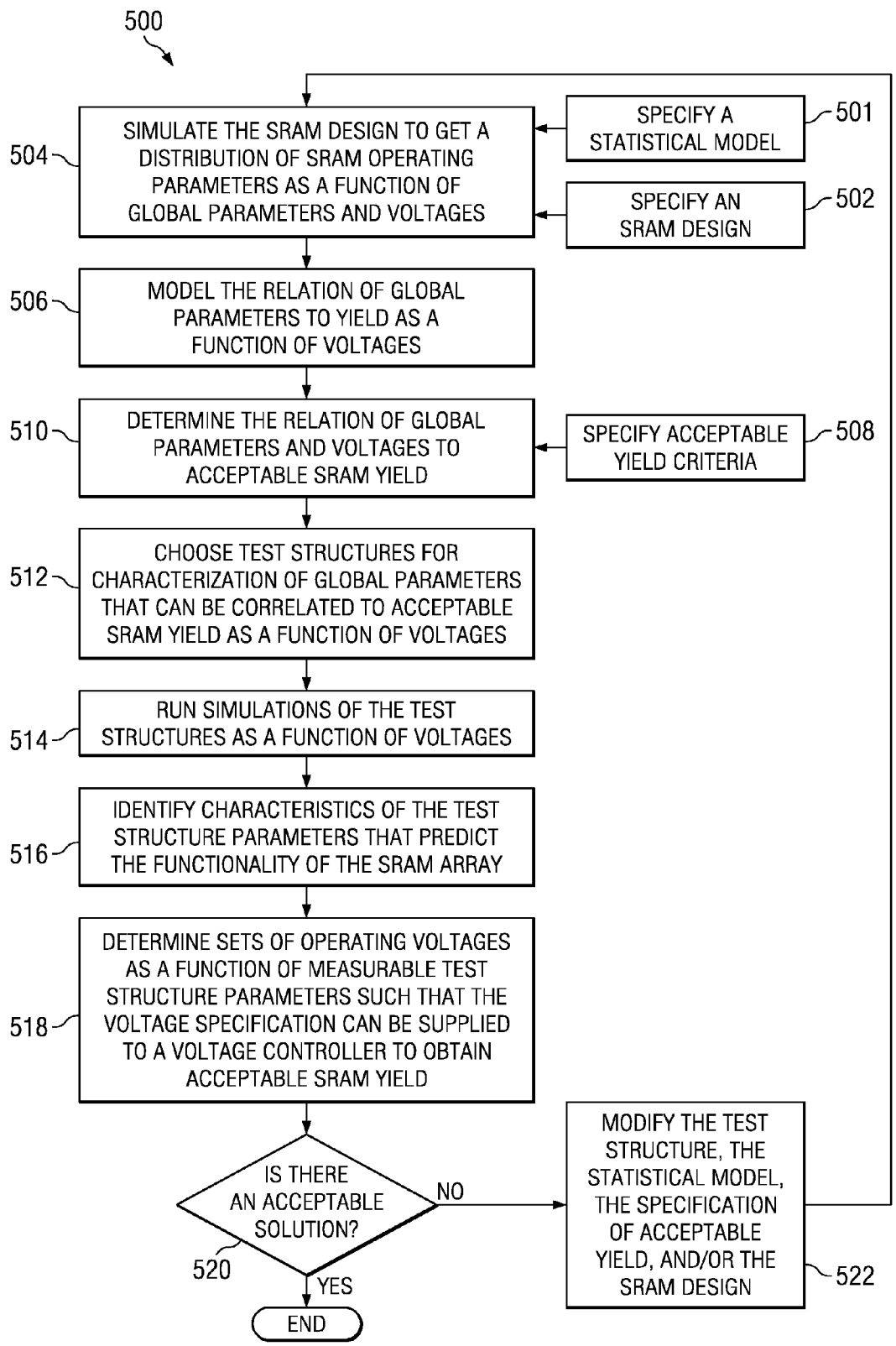
FIGS. 5 and 6 are flow diagrams illustrating another exemplary methodology that is operative to set an operating voltage for an SRAM memory device based on test structure data that models an SRAM array according to one or more aspects of the present invention.
Figure 6:
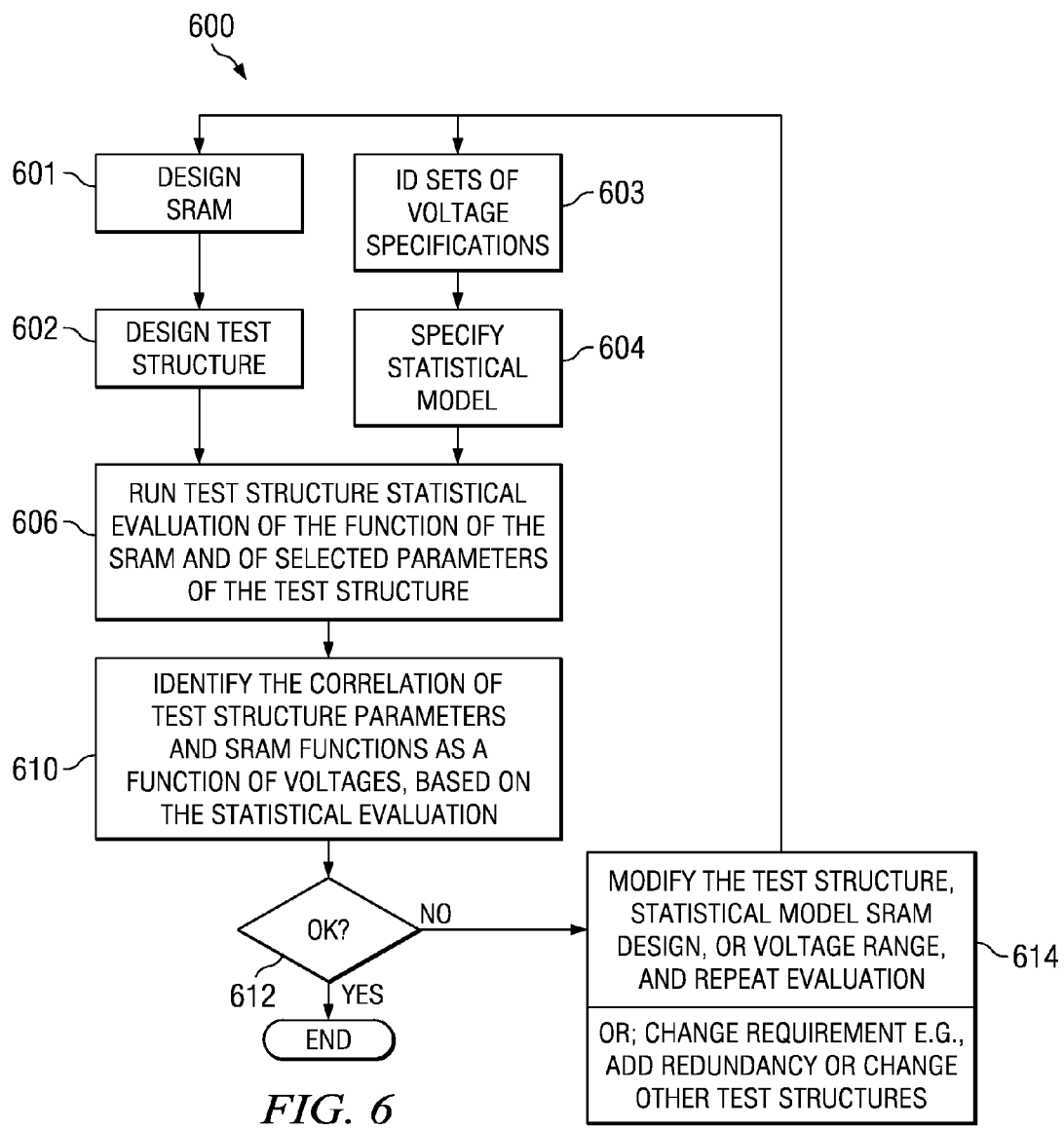

Turning to FIGS. 5 and 6, exemplary methodologies 500, 600 are illustrated that facilitate defining an SRAM test structure and model that best identifies the operating voltages for an SRAM array based on simulation data according to one or more aspects of the present invention. It will be appreciated that although the methodologies 500, 600 are illustrated and described hereinafter as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

With reference to FIG. 5, the method 500 begins at 501 where a statistical model is specified, for example, associated with the global means and sigmas and local sigmas of the elements of the SRAM array. Also, at 502, an SRAM design is specified, for example including the cell design, the array design, the periphery design and the voltage supply design. After the model is specified, the method advances to 504 where simulations of the SRAM design are run to get a distribution of the SRAM operating parameters (e.g., SNM, Vtrip, and Iread) as a function of global parameters and voltages. At 506, the relation of global parameters to yield is modeled as a function of voltages. At 510, the relation of global parameters to yield as a function of voltage and the specification of acceptable SRAM yield from 508 are used to determine the relation of global parameters and voltages to acceptable SRAM yield. At 512, test structures are chosen for characterization of global parameters that can be correlated to acceptable yield as a function of voltages.

At 514, simulations of the test structures are run, optionally as a function of voltages. At 516, Characteristics of the test structure are identified that predict the functionality of the SRAM array. At 518, sets of operating voltages are determined as a function of measurable test structure parameters such that voltage specifications can be supplied to a voltage controller to obtain acceptable SRAM yield. At 520, the analysis is examined to see if there is an acceptable solution. If so, the methodology ends. Otherwise, if there is not an acceptable solution (e.g., if there is not sufficient correlation of measurable test structure parameters with SRAM yield as a function of voltages to allow specification of voltages to obtain acceptable yield) the test structure, the statistical model, the SRAM design, and/or the specification of acceptable yield is modified at 522. The method subsequently returns to 504 and proceeds as before, and continues to do so, until a sufficiently robust test structure design and model is ascertained.

Turning to FIG. 6 a flow diagram illustrates an alternative exemplary method 600 for defining an SRAM test structure and model that identifies the operating voltage(s) for an SRAM array according to one or more aspects of the present invention. Beginning at 601 an SRAM is designed, at 602 a test structure is designed, at 603 sets of voltage specifications are identified, and at 604 a statistical model is specified. From the SRAM design at 601, the test structure design at 602, or the statistical model at 604, the method advances to 606 where a statistical evaluation of the functionality of the SRAM and of the selected parameters of the test structure is run over the range of identified voltage specifications with local and global operating parameter variation with common global parameters for the SRAM and the test structures. After the statistical evaluations are performed at 606, the method advances to 610 where the correlation of test structure parameters and SRAM functionality as a function of voltages is identified based on the statistical evaluation.

Then, at 612 a determination is made regarding whether the determined correlation of test structure parameters and SRAM yield over the range of identified voltages is satisfactory to allow specification of voltages based on test structure parameters to meet a predetermined yield or performance criteria, and/or perhaps for a specified application. If so, the methodology ends. Otherwise, the method proceeds to 614 where the test structure, statistical model SRAM design, voltage ranges, and/or other requirements are changed, such as by adding redundancy, changing the model used, or changing to other alternate test structures. The method then returns to 601, 602, 603, and 604 and a subsequent iteration is run with the changes. This is repeated until the test structure design, SRAM design, voltage range, and model achieve a correlation of test structure parameters and SRAM yield over the range of identified voltages that is satisfactory to allow specification of voltages based on test structure parameters to meet a predetermined yield or performance criteria. If the test structure design and/or model achieve a predetermined yield or performance criteria that is greater than necessary, there may also be some redesign to optimize some other aspect with some reduction of the yield or performance of the operating parameters that had greater than necessary yield or performance.

For systems with requirements for multiple SRAM operating parameters (e.g., power, access delay, or write speed) or for requirements for operation of the SRAM with different periphery voltage conditions, the design may be iterated to achieve a balance of yield or performance for the multiple operating parameters or conditions. For example, the design of an SRAM cell may be iterated to achieve a balance of yield or performance for noise margin and trip voltage over the voltage and temperature ranges of operation, for example, to minimize power for a given required level of performance in an SRAM.

Test structures may be designed to characterize selected global parameters such as NMOS drive current or PMOS drive current. Test structures may also be designed to emulate some aspect of the SRAM array, for example by use of transistors that are replicas of the transistors in the SRAM cell and/or by having a characteristic that directly relates to one of the operating parameters of the SRAM cell, such as SNM, Vtrip, or Iread. For example, FIGS. 7-11 illustrate exemplary embodiments of structures (e.g., test structures) for characterizing various parameters that may be used to predict the functionality or performance of SRAM memory devices according to various aspects of the present invention.

Figure 7:
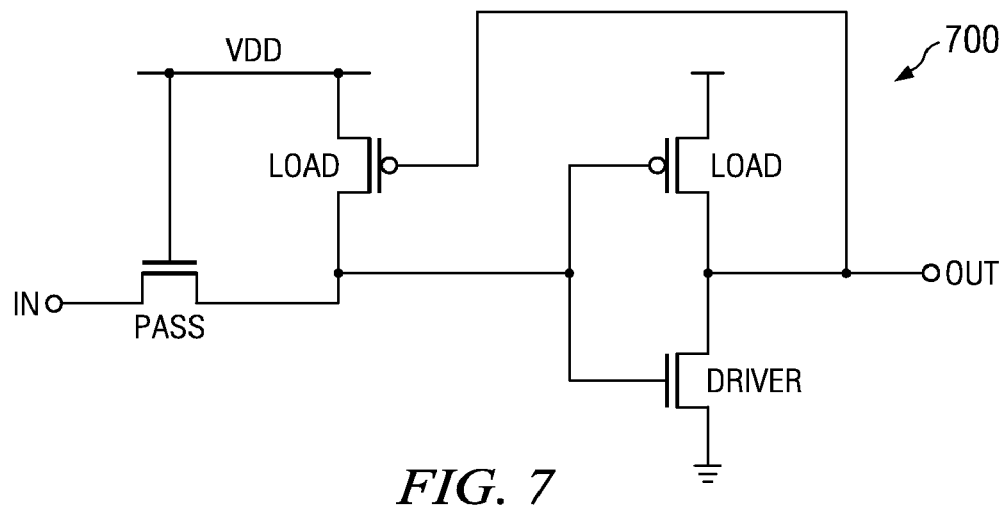
FIGS. 7-11 are schematic diagrams illustrating exemplary embodiments of structures for characterizing various parameters that may be used in predicting the performance of SRAM memory devices according to various aspects of the present invention.

For example, FIG. 7 illustrates an embodiment of a structure 700 for characterization of parameters relating to trip voltage (Vtrip). The labels "LOAD", "PASS", and "DRIVER" indicate the SRAM cell transistors emulated by the test structure transistors. The test structure transistors may be replicas of transistors in the memory cell, for example, with multiple transistors connected in parallel to average out the effect of local variation. The relation of input voltage to output voltage can be correlated to the robustness of the SRAM cell stability. The higher the input voltage required to switch the output to a low voltage, the more stable is the cell.

Figure 8:
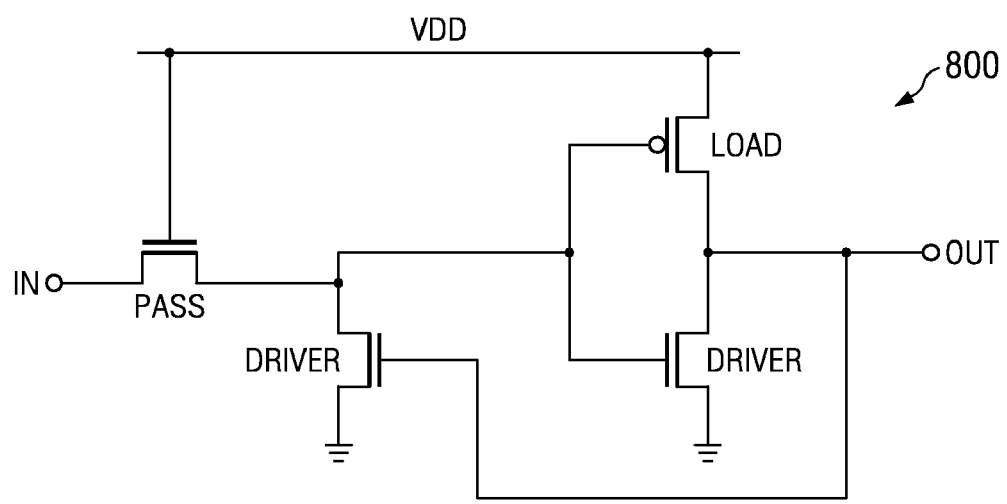

FIG. 8 illustrates another embodiment of a structure 800 for characterization of parameters relating to cell stability. The labels "LOAD", "PASS", and "DRIVER" indicate the SRAM cell transistors emulated by the test structure transistors. The test structure transistors may be replicas of transistors in the memory cell, for example, with multiple transistors connected in parallel to average out the effect of local variation. The relation of input voltage to output voltage can be correlated to the robustness of the SRAM cell stability. The lower the input voltage required to switch the output to a high voltage, the less robust is the write.

The test structures illustrated in FIGS. 7 and 8 are designed to emulate aspects of the SRAM cell (SNM and Vtrip respectively). While more complex than a standard inverter, these test structures may be referred to as inverters and the parameter measured in the characterization of these test structures can be referred to as the transition voltage of an inverter.

Figure 9:
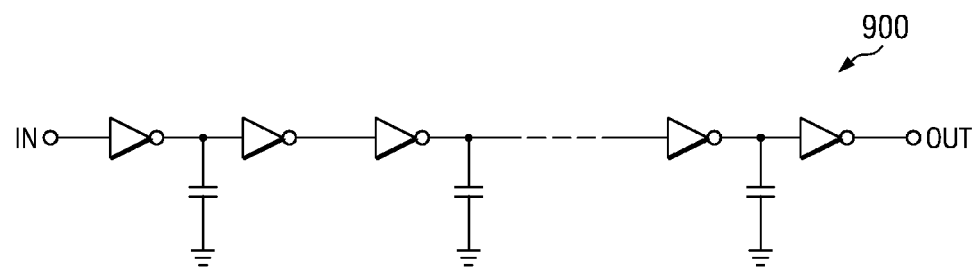

FIG. 9 illustrates an embodiment of a delay chain structure 900 for transition timing characterization of input and output parameters of a memory cell. The delay through a delay chain composed of multiple inverting elements with high capacitance on the output of odd numbered stages (e.g., first, third, fifth, . . . ) is sensitive to the pull up device in the inverting element for an input transition from high to low, and to the pull down device for an input transition of low to high. The devices in the inverting elements of the delay chain can be replicas of the transistors in a memory cell. Sensitivity to local variation can be reduced, for example, both by having wide transistors (or multiple transistors in parallel) in the inverting elements and by having multiple inverting elements in the delay chain.

Figure 10:
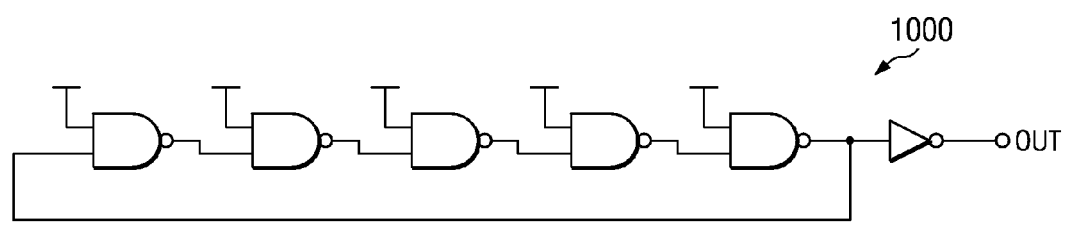

FIG. 10 illustrates an embodiment of a 5-stage NAND ring oscillator structure 1000, such as may be used for characterization of parameters that predict the functionality and performance of a memory cell. The elements within the NAND gates can be replicas of the transistors in the SRAM cell. Wider transistors, transistors in parallel, or more stages, for example, can be used to reduce sensitivity to local variation. The ring oscillator can also be converted to a delay chain by breaking the feedback path.

Figure 11:
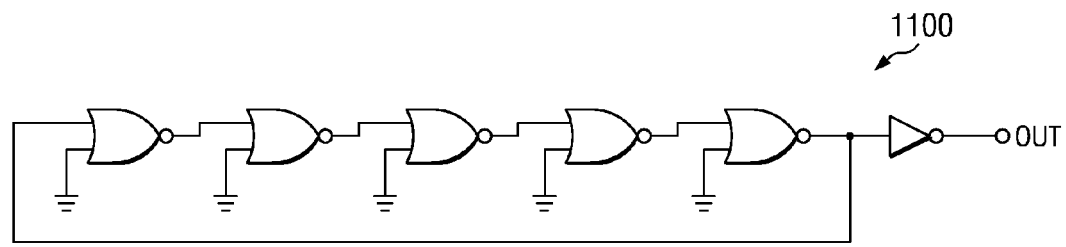

FIG. 11 illustrates an embodiment of a 5-stage NOR ring oscillator structure 1100, such as may be used for characterization of parameters that predict the functionality and performance of a memory cell. The elements within the NOR gates can be replicas of the transistors in the SRAM cell. Wider transistors, transistors in parallel, or more stages, for example, can be used to reduce sensitivity to local variation. The ring oscillator can also be converted to a delay chain by breaking the feedback path.

One or more aspects of the present invention thus provide an adaptive voltage control system configured to set the operating voltages of an SRAM memory device by utilizing a test structure configured to simulate one or more operating parameters (e.g., SNM or Vtrip) of an SRAM memory array, reading the output data of the simulated parameters, identifying a test structure operating voltage that satisfies predetermined yield or performance criteria, and setting or generating an SRAM array operating voltage based on the identified test structure operating voltage, for example, to minimize power for a given required level of performance in an SRAM.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. For example, the embodiments have been described for operating parameters with minimum acceptable values. Application can also be made for operating parameters with maximum acceptable values. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein simply means an example, rather than the best. Additionally, the phrase "based on" as utilized herein is used as an open ended phrase which is not meant to be limited to those elements which follow the phrase, but may include other elements not listed, thus the phrase may also be interpreted similar to the phrase "based at least in part on" or other variants thereof in regard to the element(s) which follow.

What is claimed is:

1. A method for setting an operating voltage for an SRAM memory device based on one or more measurable test structure characteristics that predict a functionality of an SRAM array, comprising:
  modeling or simulating a relation of one or more parameters and voltages of the SRAM array to the statistical distribution of the SRAM array operational parameters (functionality) to provide predictions of the SRAM functionality as a function of the parameters and operating voltage of the SRAM array and to identify and to select from among the one or more parameters, which substantially correspond to the predictions;
  determining a test structure that has measurable characteristics that correlate to the parameters predictive of the SRAM functionality as a function of operating voltage;
  correlating the measurable characteristics of the test structure to the functionality of the SRAM as a function of operating voltage; and
  determining and setting the operating voltage for the SRAM array based upon the predicted functionality of the SRAM array.

2. The method of claim 1, further comprising:
  specifying a statistical model for use in the modeling or simulating of a relation of one or more parameters and voltages of the SRAM array to the statistical distribution of the SRAM array operational parameters (functionality).

3. The method of claim 2, further comprising:
  designing the test structure.

4. The method of claim 3, further comprising:
  modifying at least one of the statistical model or a test structure design if the selected parameters do not substantially correspond to the predictions, or if the operating voltage of the SRAM array can not be identified based on the measurable characteristics of the test structure, or if an operating voltage that gives acceptable SRAM yield can not be identified for anticipated conditions.

5. The method of claim 1, wherein executing the simulations of the statistical distribution of the SRAM array operational parameters comprises:
  executing a sequence of evaluations of the selected SRAM array operational parameters using a simulator with parameter values chosen randomly for respective evaluations.

6. A method for providing an adaptive voltage control system, comprising:
  simulating an operating characteristic of a circuit for a range of global parameters and voltages where a resultant distribution of the simulated operating characteristics is a result of local variation of components within the circuit;
  simulating measurable characteristics of a test structure as a function of the global parameters;
  correlating the distribution of the simulated operating characteristics of the circuit with the simulated measurable characteristics of the test structure; and
  determining and setting an operating voltage for the circuit based upon the simulated measurable characteristics of the test structure as correlated to the operating characteristics of the circuit.

7. A system configured to set an operating voltage of an SRAM memory device, comprising:
  an SRAM memory array comprising an SRAM memory cell;
  a test structure configured to emulate an operating parameter of the memory cell and to characterize one or more parameters predictive of a functionality of the SRAM memory array; and
  a controller configured to set the operating voltage for the SRAM memory array based on the characterization of the one or more parameters.

8. The system of claim 7 wherein the SRAM cell comprises an SRAM cell transistor and the test structure comprises a transistor that is a replica of the SRAM cell transistor.

9. The system of claim 8 wherein the test structure comprises a plurality of transistors that are each replicas of the SRAM cell transistor and the plurality of transistors are connected in parallel.

10. The system of claim 8 wherein the test structure comprises a plurality of transistors that are each replicas of the SRAM cell transistor and the plurality of transistors are connected in series.

11. The system of claim 7 wherein the characterization of the test structure provides a transition voltage wherein the transition voltage emulates the functionality of the SRAM cell.

12. The system of claim 11 wherein the functionality of the SRAM cell is the noise margin (SNM) of the cell.

13. The system of claim 11 wherein the functionality of the SRAM cell is the trip voltage (Vtrip) of the cell.

14. The system of claim 7 wherein the controller is configured to set a maximum bound on the SRAM operating voltage.

15. The system of claim 7 wherein the SRAM memory device further comprises SRAM peripheral circuitry and wherein the controller is configured to set the SRAM operating voltage for the SRAM memory array and a peripheral circuit operating voltage for the SRAM peripheral circuitry based on the characterization of the one or more parameters.

16. The system of claim 15 wherein the operating voltage for the SRAM array is different from the peripheral circuit operating voltage for the SRAM peripheral circuitry, and wherein the controller is configured to set a bound on the difference between the SRAM array voltage and the peripheral circuitry voltage.

* * * * *